(12) United States Patent
Naruse et al.

(10) Patent No.: US 9,437,651 B2
(45) Date of Patent: Sep. 6, 2016

(54) METHOD OF MANUFACTURING IMAGING DEVICE

(71) Applicant: CANON KABUSHIKI KAISHA, Tokyo (JP)

(72) Inventors: Hiroaki Naruse, Oita (JP); Tomoyuki Tamura, Yokohama (JP); Atsushi Ogino, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 97 days.

(21) Appl. No.: 14/558,567

(22) Filed: Dec. 2, 2014

(65) Prior Publication Data

US 2015/0155329 A1    Jun. 4, 2015

(30) Foreign Application Priority Data

Dec. 4, 2013   (JP) .................................. 2013-251385

(51) Int. Cl.
  *H01L 21/00*   (2006.01)
  *H01L 27/148*  (2006.01)
  *H01L 27/146*  (2006.01)

(52) U.S. Cl.
  CPC ... *H01L 27/14689* (2013.01); *H01L 27/14612* (2013.01); *H01L 27/14636* (2013.01)

(58) Field of Classification Search
  CPC .......... H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
  USPC ......... 257/43, 432, 222, 291, 40, 88, 59, 57, 257/459, 410, 294; 438/70, 158, 59, 682, 438/161, 104, 24, 479, 585, 72, 96, 163
  See application file for complete search history.

(56) References Cited

U.S. PATENT DOCUMENTS

| 2001/0025970 | A1  | 10/2001 | Nozaki |
| 2001/0029069 | A1* | 10/2001 | Yamazaki ......... G02F 1/136227 438/149 |
| 2008/0087976 | A1  | 4/2008  | Morii |
| 2010/0026866 | A1  | 2/2010  | Matsumoto |
| 2010/0330723 | A1  | 12/2010 | Okabe |

FOREIGN PATENT DOCUMENTS

| JP | 2001-345439 A | 12/2001 |
| JP | 2006-216615 A | 8/2006 |
| JP | 2008-098373 A | 4/2008 |
| JP | 2010-056515 A | 3/2010 |
| JP | 2010-056516 A | 3/2010 |
| JP | 2010-283859 A | 12/2010 |
| JP | 2011-029604 A | 2/2011 |
| JP | 2011-243747 A | 12/2011 |
| JP | 2012-024868 A | 2/2012 |
| JP | 2013-145853 A | 7/2013 |
| JP | 2014-003333 A | 1/2014 |

* cited by examiner

*Primary Examiner* — Selim Ahmed
*Assistant Examiner* — Moin Rahman
(74) *Attorney, Agent, or Firm* — Canon U.S.A. Inc., IP Divsion

(57) ABSTRACT

One portion of a first insulator film, which is positioned on a second semiconductor region, and another portion of the first insulator film, which is positioned on a third semiconductor region, are removed, while a first portion of the first insulator film, which is positioned on a first semiconductor region is remained, one portion of a second insulator film, which is positioned on the first semiconductor region, and another portion of the second insulator film, which is positioned on the second semiconductor region, are removed, while a second portion of the second insulator film, which is positioned on the third semiconductor region is remained, and a metal film that covers the first portion, the second semiconductor region, and the second portion, and the second semiconductor region are caused to react with each other and a metal compound layer is formed.

20 Claims, 7 Drawing Sheets

PIXEL CIRCUIT UNIT        PERIPHERAL CIRCUIT UNIT

METHOD OF MANUFACTURING IMAGING DEVICE

BACKGROUND OF THE INVENTION

1. Field of the Invention

The present invention relates to a method of manufacturing an imaging device.

2. Description of the Related Art

To decrease resistance of a source/drain and/or a gate electrode of MOS transistors in imaging devices, a technology of forming a metal compound layer thereon is known.

Japanese Patent Application Laid-Open No. 2013-145853 discloses forming of a protective layer that covers a photoelectric conversion unit to form the metal compound layer.

In Japanese Patent Application Laid-Open No. 2013-145853, the protective layer and an insulating layer that is a lower layer of the protective layer are layered in a pixel region (pixel circuit unit). Meanwhile, the protective layer and the insulating layer are removed in a peripheral circuit region (peripheral circuit unit). Therefore, a difference of elevation is caused between the pixel region and the peripheral circuit region. It is difficult to resolve influence of such a difference of elevation even if applying planarization processing to an insulator film that covers, from the pixel region to the peripheral circuit region, the insulating layer and the protective layer that cause the difference of elevation.

Unevenness caused in an upper surface of the insulator film due to the influence of the difference of elevation may cause formation defect of a member such as wiring formed on the insulator film, and become a cause to decrease a manufacturing yield.

SUMMARY OF THE INVENTION

Therefore, an objective of the present technology is to decrease the difference of elevation between the pixel circuit unit and the peripheral circuit unit.

A first aspect of the present disclosure is a method of manufacturing an imaging device including a pixel circuit unit and a peripheral circuit unit, the method including: forming a first insulator film that covers a first semiconductor region positioned in the pixel circuit unit, a second semiconductor region positioned in the peripheral circuit unit, and a third semiconductor region positioned in the peripheral circuit unit; removing one portion of the first insulator film, the one portion of the first insulator film being positioned on the second semiconductor region, and another portion of the first insulator film, the another portion of the first insulator film being positioned on the third semiconductor region, while remaining a first portion of the first insulator film, the first portion being positioned on the first semiconductor region; forming a second insulator film that covers the first semiconductor region, the second semiconductor region, and the third semiconductor region; removing one portion of the second insulator film, the one portion of the second insulator film being positioned on the first portion, and another portion of the second insulator film, the another portion of the second insulator film being positioned on the second semiconductor region, while remaining a second portion of the second insulator film, the second portion being positioned on the third semiconductor region; forming a metal film that covers the first portion, the second semiconductor region, and the second portion; causing the metal film and the second semiconductor region to react with each other to form a metal compound layer; and forming a third insulator film that covers the first portion, the metal compound layer, and the second portion, and forming a conductor member that penetrates the third insulator film and comes in contact with the metal compound layer.

A second aspect of the present disclosure is a method of manufacturing an imaging device including a pixel circuit unit and a peripheral circuit unit, the method including: forming a first insulator film that covers a first semiconductor region positioned in the pixel circuit unit, a second semiconductor region positioned in the peripheral circuit unit, and a third semiconductor region positioned in at least one of the pixel circuit unit and the peripheral circuit unit; removing one portion of the first insulator film, the one portion of the first insulator film being positioned on the second semiconductor region, and another portion of the first insulator film, the another portion of the first insulator film being positioned on the third semiconductor region, while remaining a first portion of the first insulator film, the first portion being positioned on the first semiconductor region; forming a second insulator film that covers the first semiconductor region, the second semiconductor region, and the third semiconductor region; removing one portion of the second insulator film, the one portion of the second insulator film being positioned on the first portion, and another portion of the second insulator film, the another portion of the second insulator film being positioned on the second semiconductor region, while remaining a second portion of the second insulator film, the second portion being positioned on the third semiconductor region; forming a metal film that covers the first portion, the second semiconductor region, and the second portion; causing the metal film and the second semiconductor region to react with each other to form a metal compound layer; and forming a third insulator film that covers the first portion, the metal compound layer, and the second portion, and forming a conductor member that penetrates the third insulator film, and comes in contact with the metal compound layer, wherein the first semiconductor region includes a floating diffusion region of the pixel circuit unit, the first portion of the first insulator film covers the floating diffusion region, and the one portion of the second insulator film, the one portion being positioned on the floating diffusion region, is removed.

A third aspect of the present disclosure is a method of manufacturing an imaging device including a pixel circuit unit and a peripheral circuit unit, the method including: forming a first insulator film that covers a first polysilicon member positioned in the pixel circuit unit, a second polysilicon member positioned in the peripheral circuit unit, and a third polysilicon member positioned in the peripheral circuit unit; removing one part of the first insulator film, the one part of the first insulator film being positioned on the second polysilicon member, and another part of the first insulator film, the another part of the first insulator film being positioned on the third polysilicon member, while remaining a first part of the first insulator film, the first part being positioned on the first polysilicon member; forming a second insulator film that covers the first part of the first insulator film, the first part being positioned on the first polysilicon member, the second polysilicon member, and the third polysilicon member; removing one portion of the second insulator film, the one portion of the second insulator film being positioned on the first polysilicon member, and another part of the second insulator film positioned on the second polysilicon member, while remaining a second part of the second insulator film, the second part being positioned on the third polysilicon member; forming a metal film that covers the first part positioned on the first polysilicon member, and the second polysilicon member, and the second part positioned on the third polysilicon member; and causing the metal film and the second polysilicon member to react with each other.

Further features of the present invention will become apparent from the following description of exemplary embodiments (with reference to the attached drawings).

DESCRIPTION OF THE EMBODIMENTS

Hereinafter, embodiments for implementing the present invention will be described with reference to the drawings. Note that, in the description and the drawings below, a common configuration to a plurality of drawings is denoted with the same reference sign. Therefore, the common configuration will be described with reference to the plurality of drawings one another, and description of the configuration denoted with the same reference sign is omitted.

First Embodiment

Figure 1A:
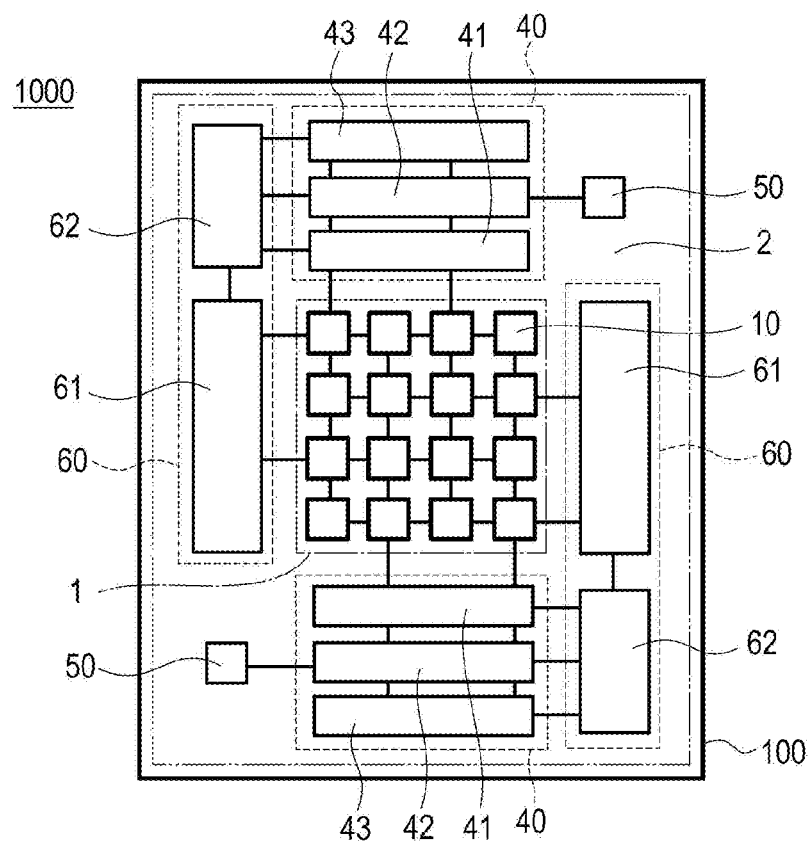
FIG. 1A is a schematic plan view of an imaging device.

An example of an imaging device 1000 will be described with reference to FIG. 1A. The imaging device 1000 includes a pixel circuit unit 1 in which pixel circuits 10 are arranged, and a peripheral circuit unit 2 in which peripheral circuits are arranged. The pixel circuit unit 1 and the peripheral circuit unit 2 are arranged on a common semiconductor layer 100. A region surrounded by the dashed-dotted line in FIG. 1A is the pixel circuit unit 1, and a region between the dashed-dotted line and the dashed-two dotted line is the peripheral circuit unit 2. The peripheral circuit unit 2 is positioned at a periphery of the pixel circuit unit 1, that is, between the pixel circuit unit 1 and an edge of the semiconductor layer 100. In FIG. 1A, an example of a region sensor in which a plurality of pixel circuits 10 is arranged in a two-dimensional manner. However, a linear sensor in which the plurality of pixel circuits 10 is arranged in a one-dimensional manner.

Figure 1B:
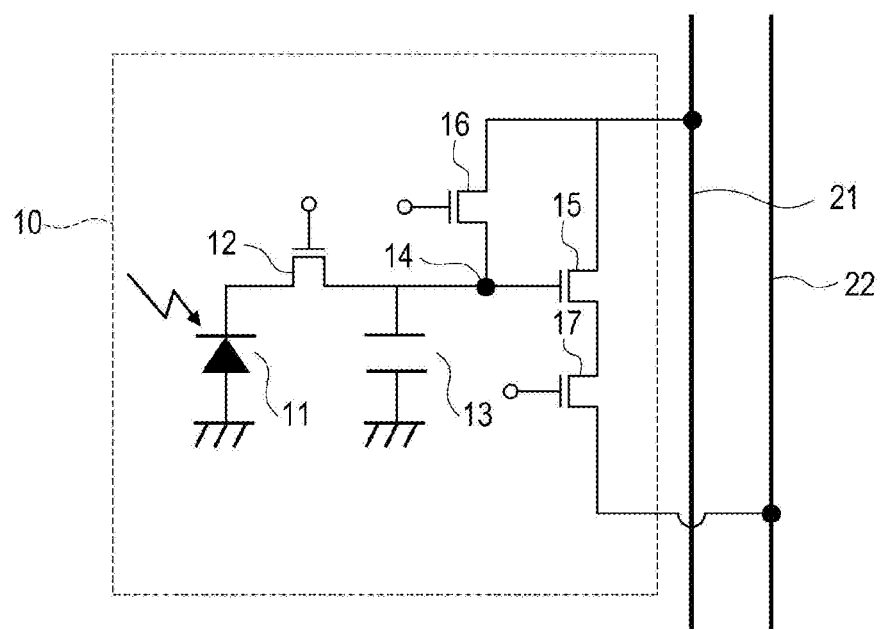
FIG. 1B is a circuit diagram of a pixel circuit.

FIG. 1B is a circuit diagram of the pixel circuit 10. The pixel circuit 10 includes a photoelectric conversion element 11, a switch element 12, a capacitor section 13, an amplifying element 15, a reset element 16, and a selection element 17. In this example, the photoelectric conversion element 11 is a photodiode, and the switch element 12 is a MOS gate. The amplifying element 15, the reset element 16, and the selection element 17 are MOS transistors. The MOS transistors that configure the pixel circuit are referred to as pixel MOS transistors. In this example, all of the pixel MOS transistors are NMOS transistors. However, the pixel MOS transistors may include a PMOS transistor.

The switch element 12 transfers a signal charge caused in the photoelectric conversion element 11 to the capacitor section 13. The capacitor section 13 causes, in a node 14, a voltage according to its capacity and an amount of the signal charge. A gate of the amplifying element 15 is connected to the capacitor section 13 through the node 14, and a drain of the amplifying element 15 is connected to a power supply line 21 through the selection element 17, and a source of the amplifying element 15 is connected to an output line 22 through the selection element 17. Gates of the capacitor section 13 and the amplifying element 15 are connected to the power supply line 21 through the reset element 16. When the reset element 16 is turned ON, a potential of the node 14 is reset to a potential according to a power supply potential. When the selection element 17 is turned ON, a signal according to the potential of the node 14 is output from the amplifying element 15 to the output line 22. The configuration of the pixel circuit unit 1 can be appropriately changed.

As illustrated in FIG. 1A, a signal processing unit 40 that processes an electrical signal generated in the pixel circuit 10 can be provided in the peripheral circuit unit 2. Further, the peripheral circuit unit 2 can include an output unit 50 for outputting a signal processed in the signal processing unit 40 to an outside and a control unit 60 for controlling the pixel circuit 10 an the signal processing unit 40, in addition to the signal processing unit 40. Circuits that configure the signal processing unit 40, the output unit 50, and the control unit 60 are collectively referred to as peripheral circuit.

In the present example, the signal processing unit 40 includes an amplification circuit 41 including a plurality of column amplifiers, a conversion circuit 42 including a plurality of column AD converters, and a horizontal scanning circuit 43 for selecting an output from the conversion circuit 42 and outputting the output to the output unit 50. The output unit 50 includes an electrode pad and a protection circuit, and the control unit 60 includes a vertical scanning circuit 61, a timing generating circuit 62, and the like. The configuration of the peripheral circuit unit 2 can be appropriately changed.

The peripheral circuit can be configured from a plurality of MOS transistors, and can be especially configured from a CMOS circuit including an NMOS transistor and a PMOS transistor. The MOS transistor that configures the peripheral circuit is referred to as peripheral MOS transistor, and when identifying a conductivity type, the MOS transistor is referred to as peripheral NMOS transistor and peripheral PMOS transistor. Further, the peripheral circuit includes not only active elements such as the transistor and the diode, but also passive elements such as a resistance element and a capacitor element.

Figure 2A:
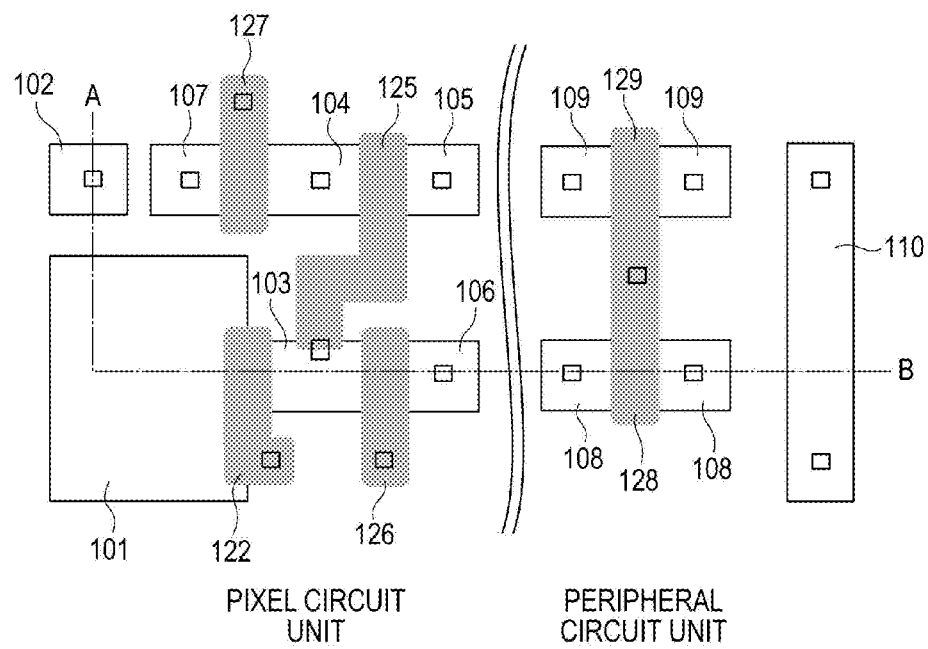
FIG. 2A is a schematic plan view of the imaging device.

A more detailed configuration will be described with reference to FIGS. 2A and 2B. FIG. 2A is a schematic plan view of the pixel circuit unit 1 and the peripheral circuit unit 2.

FIG. 2A illustrates an accumulation region 101 of the photoelectric conversion element 11, a floating diffusion region 103 that forms the capacitor section 13, and a drain 106 of the reset element 16. Further, FIG. 2A illustrates a drain 105 of the amplifying element 15, a source 104 of the amplifying element 15, and a source 107 of the selection element 17. Note that the floating diffusion region 103 also functions as a source of the reset element 16, and the source 104 of the amplifying element 15 also functions as a drain of the selection element 17. Further, FIG. 2A illustrates a source/drain 108 of the peripheral NMOS transistor, and a source/drain 109 of the peripheral PMOS transistor. All of the accumulation region 101, the floating diffusion region 103, the source/drain of the pixel MOS transistor, and the source/drain 108 of the peripheral NMOS transistor are N-type impurity regions. The source/drain 109 of the peripheral PMOS transistor is a P-type impurity region.

In the present example, all of the pixel transistors have a channel (inversion layer) of an n-type MOS FET (nMOS FET). However, the pixel transistors may include a pMOS FET. Each element of the pixel circuit 10 may include a transistor other than an insulated gate-type field effect transistor, and for example, the amplifying element 15 may be a junction-type field effect transistor (junction FET (JFET)) or may be a bipolar transistor. In the description below, in the pixel circuit, a conductive type corresponds to a conductive type in which a charge treated as a signal charge is the majority carrier is a first conductivity type, and a conductive type corresponds to a conductive type in which the charge treated as a signal charge is the minority carrier is a second conductivity type. When an electron is used as the signal charge, the n type is the first conductivity type and the p type is the second conductivity type. Note that the conductive types of the pixel transistors and the peripheral transistors can be appropriately changed.

FIG. 2A illustrates a gate electrode 122 of the switch element 12, a gate electrode 126 of the reset element 16, a gate electrode 125 of the amplifying element 15, a gate electrode 127 of the selection element 17, and a gate electrode 129 of the peripheral PMOS transistor. Further, FIG. 2A illustrates a gate electrode 128 of the peripheral NMOS transistor, and a gate electrode 129 of the peripheral PMOS transistor. Each of the gate electrodes is a polysilicon member made of polysilicon (polycrystalline silicon). Note that the gate electrode 128 and the gate electrode 129 of the present example are integrally provided. However, the gate electrode 128 and the gate electrode 129 may be separately provided.

FIG. 2A illustrates an impurity region 102 of a reference contact of the pixel circuit 10. The reference contact supplies a reference potential (ground potential) of the pixel circuit 10 through wiring. The pixel circuit unit 1 is provided with a plurality of reference contacts, whereby shading caused in an image can be suppressed.

FIG. 2A illustrates an impurity region 110 of a resistance element of the peripheral circuit. Contacts are provided at both ends of the impurity region 110, whereby resistance according to a distance between contacts can be obtained. In the present example, the impurity region 110 of the resistance element is an N type. However, the impurity region 110 may be a P type, or a resistance element including an N-type impurity region and a resistance element including a p-type impurity region may be mixed. The peripheral circuit unit 2 may be provided with other passive elements, such as a capacitor element including a MOS structure configured from a polysilicon member and a resistance element configured from a polysilicon member.

Figure 2B:
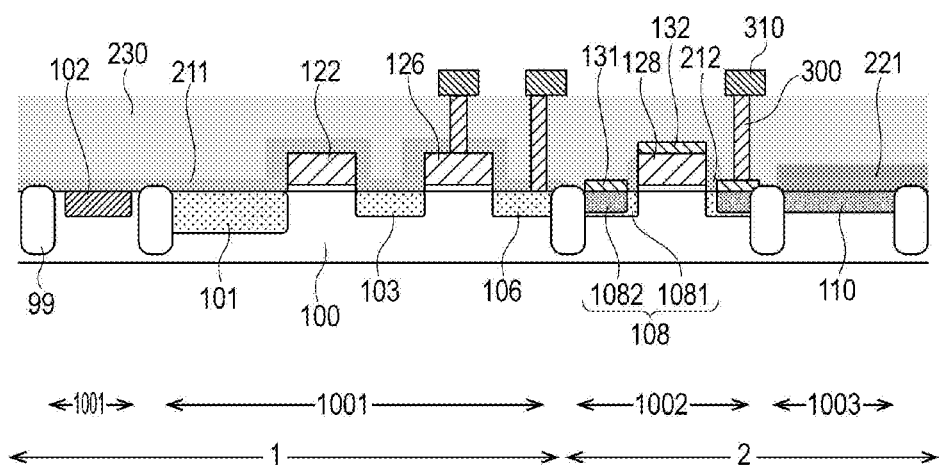
FIG. 2B is a schematic cross-sectional view of the imaging device.

FIG. 2B is a schematic cross-sectional view in the A-B line of FIG. 2A. The semiconductor layer 100 made of a semiconductor such as silicon is divided into a plurality of active regions by element isolation regions configured from insulators 99 for element isolation. Each of the active regions is configured from a semiconductor region, and an impurity region formed on the semiconductor region configures each element. Note that the "semiconductor region" is a region expanding through a specific range so as to have a specific function in the "active region". The "impurity region" means the "semiconductor region", and means a region in which an impurity is introduced into the semiconductor in order to express a function of an element. Therefore, the "semiconductor region" includes both of a region where an impurity is introduced and a region where the impurity is not introduced, of the active region. In the element isolation region, a P-type impurity region (not illustrated) for achieving PN junction/isolation can be provided.

A well (not illustrated) having a conductivity type according to the conductivity type of the element is provided in the active region of the semiconductor layer 100. The impurity region 102 has the same conductivity type as the well provided in the semiconductor layer 100, and is the P-type in the present example. The reference contact supplies the reference potential through a well for pixel MOS transistor. A P-type surface region (not illustrated) may be provided between the accumulation region 101 of the photoelectric conversion element 11 and a surface of the semiconductor layer 100.

The source/drain 108 of the peripheral NMOS transistor is configured from an N-type low-concentration impurity region 1081 and an N-type high-concentration impurity region 1082, and the peripheral NMOS transistor has an LDD structure. The source/drain 108 of the peripheral PMOS transistor is configured from a P-type low-concentration impurity region and a P-type high-concentration impurity region, and the peripheral PMOS transistor has an LDD structure.

The polysilicon member such as the gate electrode is provided on the semiconductor layer 100 through an insulating film such as a gate insulating film. Side wall spacers 212 are provided at side portions of the gate electrode 128 of the peripheral NMOS transistor. The side wall spacer 212 may be a single layer member or may be a multilayer member. The side wall spacer 212 can be configured from a silicon nitride layer and a silicon oxide layer positioned between the silicon nitride layer and the gate electrode 128.

A metal compound layer 131 such as a silicide layer is provided on the source/drain 108 of the peripheral NMOS transistor. A metal compound layer 132 such as a silicide layer is provided on an upper surface of the gate electrode 128 of the peripheral NMOS transistor. The same applies to the peripheral PMOS transistor.

A first insulator member 211 and a second insulator member 221 are provided on the semiconductor layer 100. The first insulator member 211 covers the accumulation region 101, the gate electrode 122, the floating diffusion region 103, the gate electrode 126, and the drain 106. Further, the first insulator member 211 covers the source 104, the drain 105, the gate electrode 125, the gate electrode 127, the source 107, and the impurity region 102. The second insulator member 221 covers the impurity region 110.

The first insulator member 211 and the second insulator member 221 may be formed of mutually different materials, or may be formed of the same material. For example, the first insulator member 211 includes a silicon nitride layer or a silicon oxynitride layer, and the second insulator member 221 includes a silicon oxide layer. Each member may be a single layer member, or may be a multilayer member. For example, the first insulator member 211 can be configured from a silicon nitride layer and a silicon oxide layer positioned between the silicon nitride layer and the semiconductor layer 100. The first insulator member 211 positioned on the accumulation region 101 can function as an antireflection film.

The semiconductor regions of the semiconductor layer 100 can be classified into a plurality of types according to the member formed on the semiconductor region. In the present embodiment, as illustrated in FIG. 2B, the semiconductor regions are classified into a first semiconductor region 1001, a second semiconductor region 1002, and a third semiconductor region 1003. Each type of the semiconductor region is associated with any of the first insulator member 211, the second insulator member 221, and the metal compound layer 131. In the description below, each of the first semiconductor region 1001, the second semiconductor region 1002, and the third semiconductor region 1003 is a generic name of a plurality of semiconductor regions, which is common in a point described below. The first semiconductor region 1001 can be rephrased as a first-type semiconductor region, the second semiconductor region 1002 can be rephrased as a second-type semiconductor region, and the third semiconductor region 1003 can be rephrased as a third-type semiconductor region, respectively. The first semiconductor region 1001, the second semiconductor region 1002, and the third semiconductor region 1003 can be dispersed on the semiconductor layer 100.

The first semiconductor region 1001 is covered with the first insulator member 211, and the third semiconductor region 1003 and the second semiconductor region 1002 are not covered with the first insulator member 211. The third semiconductor region 1003 is covered with the second insulator member 221, and the first semiconductor region 1001 and the second semiconductor region 1002 are not covered with the second insulator member 221. The second semiconductor region 1002 is covered with the metal compound layer 131, and the first semiconductor region 1001 and the third semiconductor region 1003 are not covered with the metal compound layer 131.

In the present embodiment, the first semiconductor region 1001 is an area of the active region, in which the accumulation region 101, the impurity region 102, the floating diffusion region 103, and the drain 106 are provided. Further, the first semiconductor region 1001 is an area of the active region, in which the drain 105, the source 104, and the source 107 are provided. The second semiconductor region 1002 is an area of the active region, in which the sources/drains 108 and 109 are provided. The third semiconductor region 1003 is an area of the active region, in which the impurity region 110 is provided.

The polysilicon members can be classified into a plurality of types, similarly to the semiconductor region. In the present embodiment, the polysilicon members are classified into a first polysilicon member and a second polysilicon member. Each of the polysilicon members is associated with any of the first insulator member 211, the second insulator member 221, and the metal compound layer 131. The first polysilicon member can be rephrased as a first-type polysilicon member, and the second polysilicon member can be rephrased as a second-type polysilicon member, respectively.

The first polysilicon member is covered with the first insulator member 211, and the second polysilicon member is not covered with the first insulator member 211. The second polysilicon member is not covered with the first insulator member 211 and the second insulator member 221. The second polysilicon member is covered with the metal compound layer 132, and the first polysilicon member is not covered with the metal compound layer 132.

In the present embodiment, the first polysilicon member includes the gate electrodes 122, 126, 125, and 127. The second polysilicon member includes the gate electrodes 128 and 129.

A third insulator film 232 is provided to cover the first insulator member 211, the second insulator member 221, and the metal compound layers 131 and 132. A contact plug 300 that is a conductor member is provided to penetrate the third insulator film 232. A wiring layer 310 is connected to the contact plug 300. A wiring layer is further provided on the wiring layer 310 through an interlayer insulating layer.

The imaging device of the present embodiment may be a surface irradiation-type imaging device, in which a main surface on the side of the gate electrode 122 and the wiring layer 310 of the semiconductor layer 100 serves as a light receiving surface, or may be a back surface irradiation-type imaging device, in which the main surface on the opposite side to the side of the gate electrode 122 and the wiring layer 310 of the semiconductor layer 100 serves as the light receiving surface. However, the present embodiment is favorable for the surface irradiation-type imaging device. This is because the present embodiment can allow the height of the insulator of the pixel circuit unit to become small, and thus an effect to improve sensitivity can be obtained in the surface irradiation-type imaging device.

A microlens array, a color filter array, and the like are provided on the side of the light receiving surface of the semiconductor layer 100. The imaging device 1000 can includes a chip including the semiconductor layer 100 and a package that houses the chip. An imaging system such as a camera or an information terminal into which the imaging device 1000 is incorporated can be constructed.

A method of manufacturing the imaging device 1000 according to the first embodiment will be described with reference to FIGS. 3A to 3D to 5I to 5L.

In the present embodiment, the first semiconductor region 1001 is an area corresponding to the accumulation region 101, the impurity region 102, the floating diffusion region 103, and the drain 106. Further, the first semiconductor region 1001 is an area corresponding to the drain 105, the source 104, and the source 107. The second semiconductor region 1002 is an area corresponding to the sources/drains 108 and 109. The third semiconductor region 1003 is an area corresponding to the impurity region 110. Here, the "area corresponding to the impurity region" means both of the semiconductor region where the impurity region is already formed, and the semiconductor region where the impurity region is to be formed later.

Formation of each of the impurity regions can be performed as follows. First, a portion of the semiconductor region, which is other than a portion where the impurity region is formed, is covered with a mask configured from a photosensitive resin or an inorganic insulator. Then, an impurity is introduced (doped) to the portion of the semiconductor region, which is not covered with the mask, by a known method such as ion implantation. The mask may be removed afterward, or may be remained.

Formation of each of the insulator members can be performed as follows. First, a portion of the insulator film, which is other than a portion to be remained (a portion that becomes the insulator member), is covered with a mask configured from a photosensitive resin or an inorganic insulator. Then, the portion of the insulator film, which is not covered with the mask, is removed by etching such as dry etching or wet etching. The mask may be removed afterward, or may be remained. Besides the above method, the insulator member can be formed by patterning of an insulator film using a lift-off method.

The metal compound layers 131 and 132 are formed using a salicide (self-aligned silicide) process. The first insulator member 211 and the second insulator member 221 are then used as silicide blocks in the silicide process.

In the description below, manufacturing processes a to k of the imaging device 1000 of the first embodiment having the section structure illustrated in FIG. 2B will be described with reference to the cross-sectional views in a typical process order. Note that, for simplification of the description, the first semiconductor region that finally becomes the first semiconductor region 1001 is referred to as first semiconductor region 1001 from the beginning of the manufacturing process. The same applied to the second semiconductor region that finally becomes the second semiconductor region 1002 and the third semiconductor region that finally becomes the third semiconductor region 1003.

(Process a)

Figure 3A:
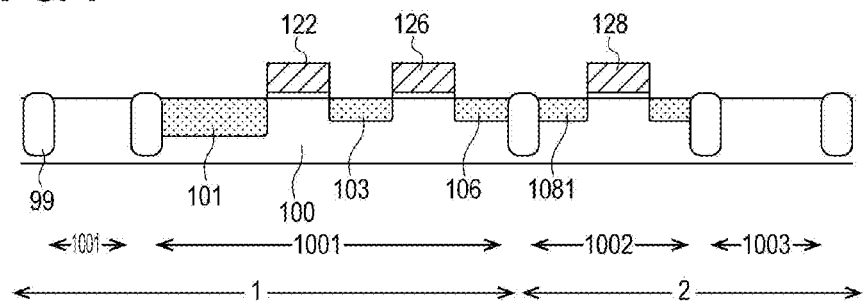
FIGS. 3A to 3D are schematic cross-sectional views illustrating a method of manufacturing the imaging device.

FIG. 3A illustrates a state that has gone through a process a of forming a polysilicon member on the semiconductor layer 100, and forming an impurity region on the semiconductor layer 100. As the semiconductor layer 100, a silicon wafer cut from an ingot of single crystal silicon. Other than the above, as the semiconductor layer 100, a single crystal silicon layer (epitaxial layer) formed on the silicon wafer by epitaxial growth can be used. In the process a, first, the insulator 99 for element insulation is formed on the semiconductor layer 100. Further, polysilicon members as the gate electrodes 122, 126, and 128 are formed on the semiconductor layer 100 through a gate insulating film. Further, the accumulation region 101 of the photoelectric conversion element 11 is formed. Further, the floating diffusion region 103 and the drain 106 of the capacitor section 13, and the N-type low-concentration impurity region 1081 are formed. Introduction of an impurity to the first semiconductor region 1001 for formation of the floating diffusion region 103 and introduction of an impurity to the second semiconductor region 1002 for formation of the N-type low-concentration impurity region 1081 can be performed in parallel. Therefore, dosages in the ion implantation at the time of forming the floating diffusion region 103 and in the ion implantation at the time of forming the impurity region 1081 may be the same. As a result, the impurity concentration of the floating diffusion region 103 and the impurity concentration of the N-type low-concentration impurity region 1081 could be the same level (one is 0.5 to 2.0 times of the other). The forming order in the present process is arbitrary.

(Process b)

Figure 3B:
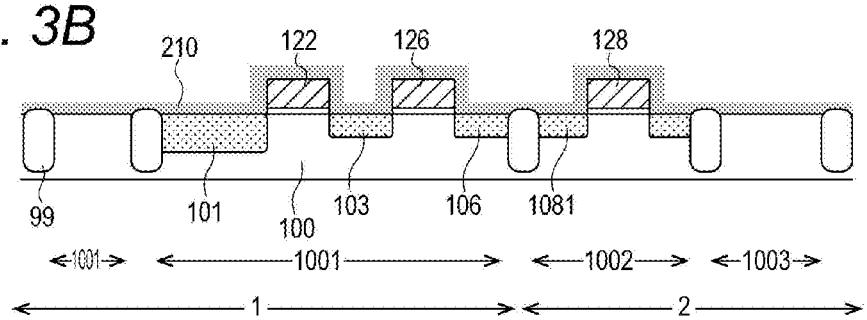

FIG. 3B illustrates a state that has gone through a process b of forming a first insulator film 210. The first insulator film 210 covers the first semiconductor region 1001 positioned in the pixel circuit unit 1, the second semiconductor region 1002 positioned in the peripheral circuit unit 2, and in the peripheral circuit unit 2. The third semiconductor region 1003 may be positioned in the pixel circuit unit 1. The first insulator film 210 can be formed to cover the entire semiconductor layer 100.

Further, the first insulator film 210 is formed to cover the gate electrodes 122 and 126 that are the first polysilicon members positioned on the first semiconductor region 1001, and the gate electrode 128 that is the second polysilicon member positioned on the second semiconductor region 1002.

The thickness of the first insulator film 210 may be the same as or smaller than the thickness of the polysilicon member as the gate electrode. The thickness of the first insulator film 210 is favorably 1/5 times or more of the thickness of the polysilicon member. The first insulator film 210 may be a laminated film. For example, the first insulator film 210 can be configured from a lower-layer silicon oxide layer, and an upper-layer silicon nitride layer that is thicker than the silicon oxide layer.

(Process c)

Figure 3C:
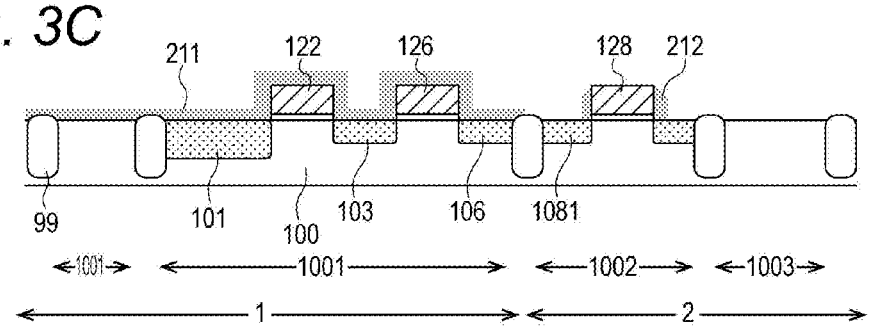

FIG. 3C illustrates a state that has gone through a process c of forming the first insulator member 211. In the process c, a portion of the first insulator film 210, which is positioned on the second semiconductor region 1002, and a portion of the first insulator film 210, which is positioned on the third semiconductor region 1003, are removed. At this time, a portion of the first insulator film 210, which is positioned on the first semiconductor region 1001, is remained. The portion (first portion) of the first insulator film 210, which is positioned on the first semiconductor region 1001, becomes the first insulator member 211. Further, portions of the first insulator film 210, which are positioned on side surfaces of the gate electrode 128, are remained. The certain portions of the first insulator film 210, which are positioned on the side surfaces of the gate electrode 128, become the side wall spacers 212 with respect to the gate electrode 128 that is the polysilicon member.

The portion on the first insulator film 210, which has been remained on the first semiconductor region 1001, covers the accumulation region 101. The portion of the first insulator film 210, which has been remained on the first semiconductor region 1001, covers the floating diffusion region 103. A portion of the first insulator film 210, which is to be remained on the first semiconductor region 1001, covers the source/drain of the pixel MOS transistor. For example, the portion of the first insulator film 210, which has been remained on the first semiconductor region 1001, covers the drain 106. For example, the portion of the first insulator film 210, which is to be remained on the first semiconductor region 1001, covers the drain 105 and the source 104 of the amplifying element 15 of the pixel circuit unit 1. Etching of a portion of the first insulator film 210, which is positioned on the amplifying element 15, is limited, whereby etching damage to the amplifying element 15 is decreased, and a noise caused by the amplifying element 15 can be decreased.

Further, portions of the first insulator film 210, which are positioned on the second polysilicon member (gate electrodes 128 and 129), are removed. At this time, portions of the first insulator film 210, which are positioned on the first polysilicon members (gate electrodes 122, 126, 125, and 127), are remained.

(Process d)

Figure 3D:
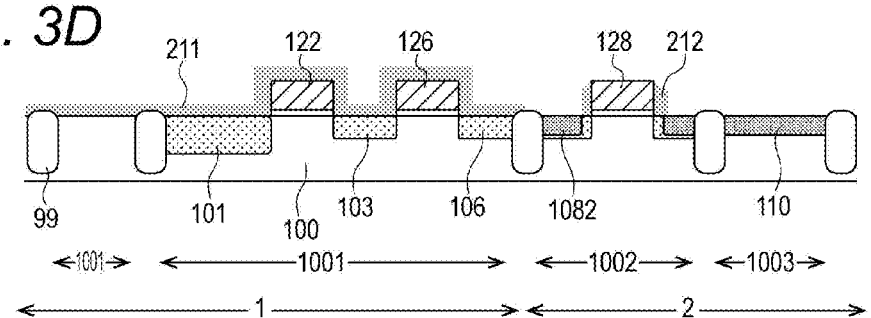

FIG. 3D illustrates a state that has gone through a process d of forming an impurity region on the semiconductor layer 100. With the process d, the impurity region 110 of the resistance element is formed. Further, in the process d, an impurity is introduced to the second semiconductor region 1002. Accordingly, the N-type high-concentration impurity region 1082 of the source/drain 108 of the peripheral NMOS transistor is formed. The impurity is introduced with a dosage (second dosage) that is higher than a dosage (first dosage) at the time of forming the N-type high-concentration impurity region 1082, whereby the LDD structure is formed. The introduction of the impurity to the second semiconductor region 1002 for the N-type high-concentration impurity region 1082 and the introduction of the impurities to the third semiconductor region 1003 for the impurity region 110 can be performed in parallel. Therefore, the impurity concentration of the impurity region 110 and the impurity concentration of the N-type high-concentration impurity region 1082 could be the same level (one is 0.5 to 2.0 times of the other). When the resistance element including a P-type impurity region is formed, the P-type impurity region of the resistance element can be formed in parallel with formation of the P-type high-concentration impurity region of the source/drain 109 of the peripheral PMOS transistor. The dosage for the formation of the high-concentration impurity regions of the sources/drains 108 and 109 of the peripheral MOS transistor falls within a practical range to adequately decrease the resistivity of the impurity region 110 as the resistance element.

An appropriate range of the second dosage when the high-concentration impurity region that forms the LDD structure is formed is $5\times10^{14}$ to $5\times10^{16}$ [ions/cm$^2$], and $10^{16}$ favorably $1\times10^{15}$ to $1\times10$ [ions/cm$^2$]. In contrast, an appropriate range of the first dosage when the low-concentration impurity region that forms the LDD structure is $5\times10^{12}$ to $5\times10^{14}$ [ions/cm$^2$], and favorably $1\times10^{13}$ to $1\times10^{14}$ [ions/cm$^2$]. In the stage of the process a, the impurity region 110 can be formed in parallel with the low-concentration impurity regions of the sources/drains 108 and 109. However, only with the first dosage, the resistivity of the impurity region 110 becomes extremely high, and thus it becomes difficult to obtain sufficient characteristics as the resistance element.

(Process e)

Figure 4E:
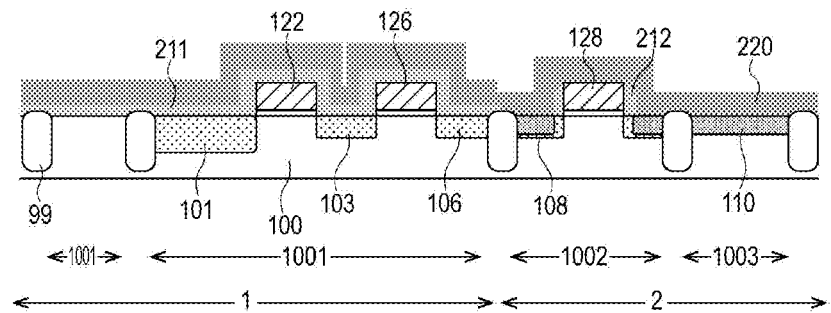
FIGS. 4E to 4H are schematic cross-sectional views illustrating a method of manufacturing the imaging device.

FIG. 4E illustrates a state that has gone through a process e of forming a second insulator film 220. The second insulator film 220 covers the first insulator member 211 that is the portion of the first insulator film 210, which is remained on the first semiconductor region 1001, the second semiconductor region 1002, and the third semiconductor region 1003. The second insulator film 220 can be formed to cover the entire semiconductor layer 100.

A portion of the second insulator film 220, which is positioned on the first semiconductor region 1001, covers the accumulation region 101. The portion of the second insulator film 220, which is positioned on the first semiconductor region 1001, covers the floating diffusion region 103. A portion of the second insulator film 220, which is positioned on the third semiconductor region 1003, covers the source/drain of the pixel MOS transistor. The portion of the second insulator film 220, which is positioned on the first semiconductor region 1001, covers the drain 105 and the source 104 of the amplifying element of the pixel circuit unit 1.

The second insulator film 220 covers a portion of the first insulator film 210, which is positioned on the first polysilicon member, and the second polysilicon members.

The thickness of the second insulator film 220 may be the same as or smaller than the thickness of the polysilicon member. The thickness of the second insulator film 220 is favorably 1/5 times or more of the thickness of the polysilicon member. Further, the thickness of the second insulator film 220 may be the same as or smaller than the thickness of the first insulator film 210. This is because, while the first insulator film 210 needs to be relatively thicker to form the side wall spacer 212, it is not necessary to form the side wall spacer from the second insulator film 220.

(Process f)

Figure 4F:
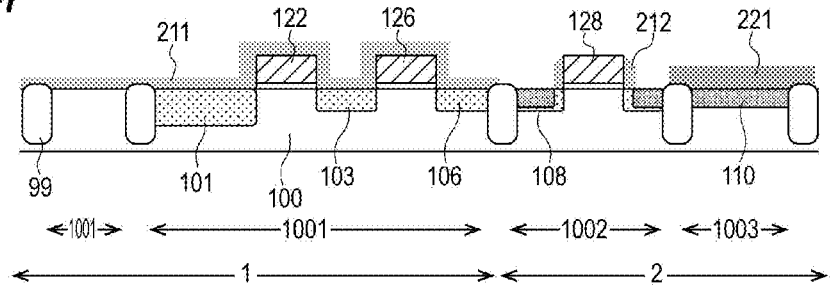

FIG. 4F illustrates a state that has gone through a process f of forming a second insulator member 221. In the process f, the portion of the second insulator film 220, which is positioned on the first semiconductor region 1001, and the portion of the second insulator film 220, which is positioned on the second semiconductor region 1002, are removed. At this time, the portion of the second insulator film 220, which is positioned on the third semiconductor region 1003, is remained.

The portion (second portion) of the second insulator film 220, which has been remained on the third semiconductor region 1003, covers the impurity region 110 of the resistance element, as the second insulator member 221.

Further, portions of the second insulator film 220, which are positioned on the first polysilicon members (gate electrodes 122, 126, 125, and 127), and portions of the second insulator film 220, which are positioned on the second polysilicon members (gate electrodes 128 and 129), are removed.

Etching of the second insulator film 220 is performed to cause at least a portion of the second insulator film 220, which overlaps with the first insulator member 211, to be thin (to cause the thickness of the portion to be small). Favorably, the etching is performed to cause the thickness of the portion of the second insulator film 220, which overlaps with the first insulator member 211, to become zero, and to expose the first insulator member 211. The exposed first insulator member 211 is kept covering the first semiconductor region 1001 and the first polysilicon member. To achieve that, the first insulator member 211 is favorably not etched as much as possible at the time of etching of the second insulator film 220. To achieve that, an etching condition of the second insulator film 220 is favorably a condition where an etching selectivity ratio to the first insulator film 210 (first insulator member 211) is large. A specific etching selectivity ratio is 3 or more, for example.

(Process g)

Figure 4G:
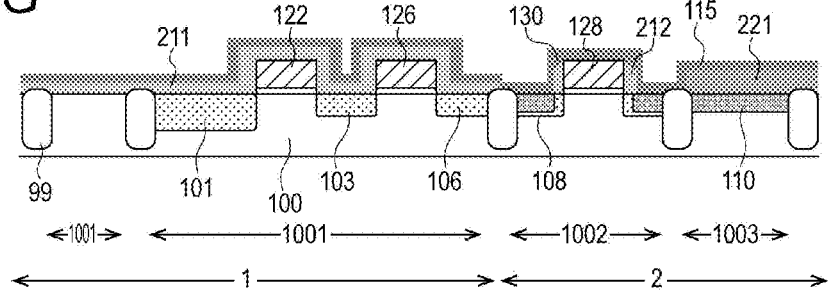

FIG. 4G illustrates a state that has gone through a process g of forming a metal film 130. In the process g, a metal film 130 covers at least one of (in the present example, both of) the second semiconductor region 1002 and the second polysilicon members (gate electrodes 128 and 129). The metal film 130 covers the first insulator member 211 that is the portion of the first insulator film 210, which has been remained on the first semiconductor region 1001, the second semiconductor region 1002, and the second insulator member 221 that is the portion of the third insulator film, which has been remained on the third semiconductor region 1003. The metal film 130 can be formed to cover the entire semiconductor layer 100.

Further, the metal film 130 covers the second insulator member 221 that is the portion of the first insulator film 210, which is positioned on the first polysilicon member, and the second insulator member 221 that is a portion of the second insulator film, which is positioned on the second polysilicon members.

The metal film 130 comes in contact with at least one of the second semiconductor region 1002 and the second polysilicon members (gate electrodes 128 and 129). Meanwhile, the metal film 130 is not contact with the second insulator member 221 and the first semiconductor region 1001, the third semiconductor region 1003, and the first polysilicon members (gate electrodes 122, 126, 125, and 127), which are blocked by the second insulator member 221.

The metal film 130 includes a metal that could react with the second semiconductor region 1002 or the second polysilicon members to form a metal compound layer. The metal film 130 may be a single layer film or may be a multilayer film. First, a lower-layer refractory metal layer is formed by a sputtering method, or the like. An upper-layer anti-oxidation layer for preventing oxidation of the refractory metal layer is deposited on the refractory metal layer. As a material of the refractory metal layer, cobalt can be used, for example, and as a material of the anti-oxidation layer, titanium nitride can be used. In addition to the above, as the material of the refractory metal layer, titanium, nickel, tungsten, molybdenum, tantalum, chromium, palladium, or platinum may be used. Further, as the material of the anti-oxidation layer, nickel nitride or the like may be used. The metal compound layer could be a silicide if the semiconductor region is silicon, and the metal compound layer could be a germanide if the semiconductor region is germanium.

(Process h)

Figure 4H:
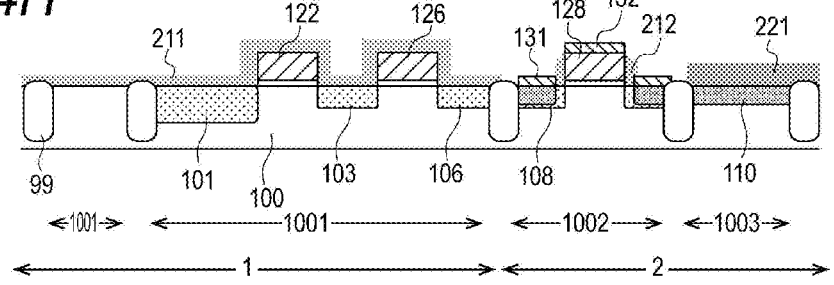

FIG. 4H illustrates a state that has gone through a process h of forming metal compound layers 131 and 132. The metal compound layer 131 is formed such that the metal film 130 and the second semiconductor region 1002 react with each other. Further, the metal compound layer 132 is formed such that the metal film 130 and the second polysilicon member react with each other. The metal compound layers 131 and 132 are silicide layers if the semiconductor layer and the gate electrodes are silicon, and for example, the metal compound layers are cobalt silicide layers if the metal contained in the refractory metal layer is cobalt.

To be specific, first, silicidation of about 500° C. is applied, and the refractory metal layer, and the second semiconductor region 1002 of the semiconductor layer 100 and the second polysilicon members (gate electrodes 128 and 129) are caused to react with each other and mono-silicidized, whereby a monosilicide layer is formed. At this time, the metal film 130 is blocked by the first insulator member 211 and does not react with the first semiconductor region 1001 and the first polysilicon members (gate electrodes 122, 126, 125, and 127). Therefore, the monosilicide layer is not formed on the first semiconductor region 1001 and the first polysilicon member. Similarly, at this time, the metal film 130 is blocked by the second insulator member 221 and does not react with the third semiconductor region 1003, and the monosilicide layer is not formed on the third semiconductor region 1003.

Accordingly, an increase in a dark current due to metal contamination of the pixel circuit 10, especially, the photoelectric conversion element 11 is suppressed. Further, reduction of the resistance of the resistance element is suppressed.

Following that, an unreacted portion positioned on the first semiconductor region 1001 is removed through the first insulator film 210 of the metal film 130. Further, an unreacted portion positioned on the first polysilicon member is removed through the first insulator film 210 of the metal film 130.

To be specific, the anti-oxidation layer and the unreacted refractory metal layer are immersed in sulfuric acid hydrolysis and removed. In sulfuric acid hydrolysis processing at this time, the first insulator member 211 and the second insulator member 221 are little dissolved. Following that, silicidation of about 800° C. is applied, whereby the metal compound layers 131 and 132 that are disilicide layers with low resistance are formed.

Note that the refractory metal is dispersed in the first insulator member 211 or the second insulator member 221, and a metal component may be remained on the surface of the first insulator member 211 or the second insulator member 221 even if the sulfuric acid hydrolysis processing is performed. Therefore, a part (surface layer) of the upper surface of the first insulator member 211 or the second insulator member 221 is removed by etching or the like, so that the metal component dispersed on the first insulator member 211 or the second insulator member 221 may be removed.

(Process i)

Figure 5I:
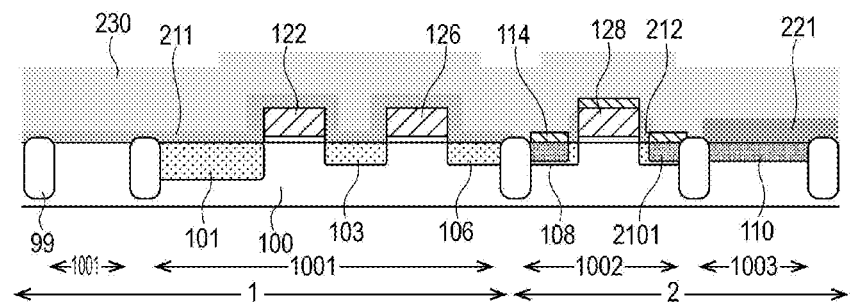
FIGS. 5I to 5L are schematic cross-sectional views illustrating a method of manufacturing the imaging device.

FIG. 5I illustrates a state that has gone through a process i of forming a third insulator film 230. A third insulator film 231 covers the first insulator member 211 that is a remained portion of the first insulator film 210 and the second insulator member 221 that is a remained portion of the second insulator film 220. Further, the third insulator film 231 covers the metal compound layers 131 and 132. The third insulator film 230 can be formed to cover the entire semiconductor layer 100.

(Process j)

Figure 5J:
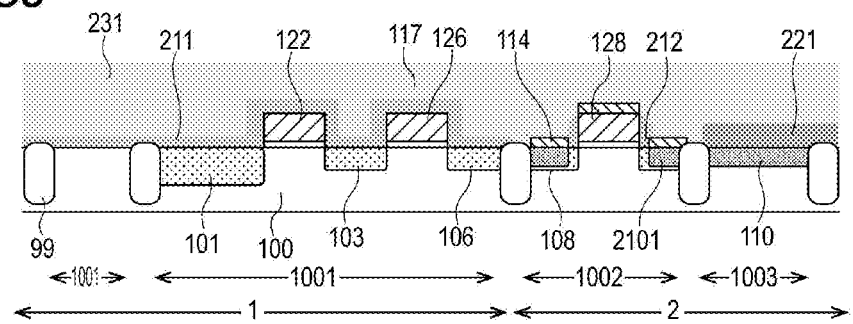

FIG. 5J illustrates a state that has gone through a process j of planalizing the third insulator film 230. In the process j, the third insulator film 230 is planalized, whereby the third insulator film 231 having a planar surface is formed. As a technique of planarization, a CMP method is favorable. However, etch back method or a reflow method can be employed.

(Process k)

Figure 5K:
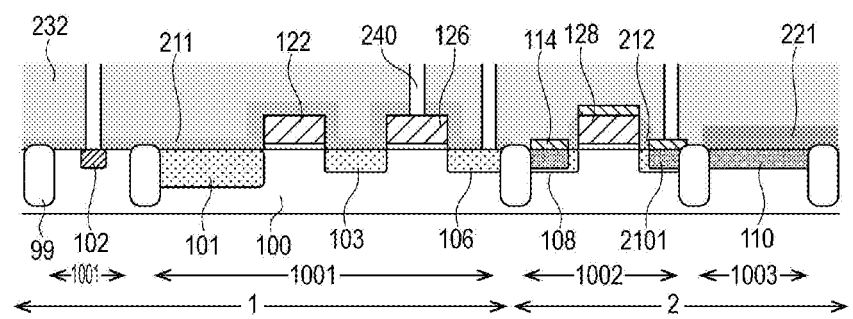

FIG. 5K illustrates a state that has gone through a process k of forming a contact hole 240 in the third insulator film 231. In the process k, an appropriate mask is formed on the third insulator film 231 and the third insulator film 231 is etched, whereby the third insulator film 232 having the contact hole 240 is formed. The contact hole 240 penetrates the third insulator film 232. Then, the contact hole 240 exposes the first semiconductor region 1001, the second semiconductor region 1002, the metal compound layers 131 and 132, and the first polysilicon member.

The third insulator film 230 formed in the process i may be a single layer film, but is favorably a multilayer film. The third insulator film 230 as a multilayer film can include an upper layer that is planalized in the process j, and a lower layer (etch stop layer) that functions as an etching stopper with respect to the contact hole 240 formed in the upper layer in the process k. For example, the lower layer can be a silicon nitride layer, and the upper layer can be a silicate glass layer such as BPSG. By use of the etch stop layer, damage to the semiconductor layer 100 and the metal compound layers 131 and 132 can be suppressed. When the contact hole 240 reaches the etch stop layer, the etch stop layer is etched in an etching condition different from the upper layer, and the contact hole 240 that penetrates the third insulator film 232 is formed. Before the upper layer is formed, the lower layer can be patterned into an appropriate form. To be specific, the patterning can be performed such that a portion of the lower-layer insulator film, where the contact hole 240 is provided, is remained, and a portion other than the portion of the lower-layer insulator film, where the contact hole 240 is provided, is removed. Further, the contact hole 240 that exposes the first semiconductor region 1001, the third semiconductor region 1003, and the first polysilicon member is a first contact hole. The contact hole that exposes the metal compound layers 131 and 132 is a second contact hole. The first and second contact hole can be formed using the same mask at the same time. However the first and second contact holes can be separately formed. By separately forming of the first and second contact holes, the metal contamination of the first semiconductor region 1001 and the third semiconductor region 1003 due to the metal component of the metal compound layers 131 and 132 is suppressed.

Next, the P-type impurity is ion-implanted through the contact hole 240, so that the P-type impurity region 102 of the reference contact is formed. Further, the N-type impurity is ion-implanted through the contact hole, so that a contact impurity region (not illustrated) is formed on the pixel NMOS transistor.

(Process l)

Figure 5L:
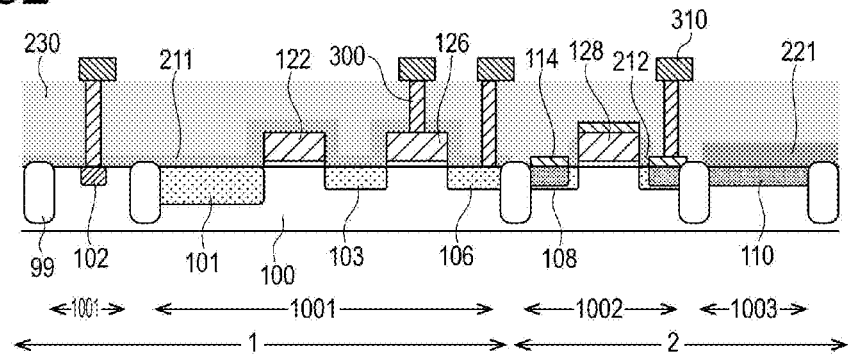

FIG. 5L illustrates a state that has gone through a process l of forming the contact plug 300 in the contact hole 240. The contact plug 300 is a conductor member that penetrates the third insulator film 232, and comes in contact with the metal compound layers 131 and 132. Further, the contact plug 300 penetrates the third insulator film 232, and comes in contact with the first semiconductor region 1001, the third semiconductor region 1003, and the first polysilicon members (gate electrodes 122, 126, 125, and 127). Following that, the wiring layer 310 connected to the contact plug 300 is formed. As a main component of the contact plug 300, tungsten can be used. As a main component of the wiring layer 310, aluminum or copper can be used.

Further, an interlayer insulating layer, a via plug, and a wiring layer are formed, and a color filter array or a microlens array is formed, so that the imaging device 1000 is completed.

According to the manufacturing method of the present embodiment, in the imaging device including the metal compound layers 131 and 132, the difference of elevation between the pixel circuit unit 1 and the peripheral circuit unit 2 can be made small. This is because, in the process f, the portion of the second insulator film 220, which is positioned on the first semiconductor region 1001, and the portion positioned on the first polysilicon member are removed. That is, the difference of elevation between the pixel circuit unit 1 and the peripheral circuit unit 2 can be made smaller than a case where the portion of the second insulator film 220, which is positioned on the first semiconductor region 1001, and the portion positioned on the first polysilicon member are not performed in the process f. The first insulator film 210 is remained above the first semiconductor region 1001 and the first polysilicon member. Meanwhile, the first insulator film 210 and the second insulator film 220 are removed in the processes c and f above the second semiconductor region 1002 and the second polysilicon member. The portion of the second insulator film 220, which is positioned on the first semiconductor region 1001, whereby the differences of elevation above the first semiconductor region 1001 and above the second semiconductor region 1002 can be reduced by the thickness of the second insulator film 220.

Second Embodiment

A method of manufacturing an imaging device 1000 that includes a pixel circuit unit 1 in which pixel circuits 10 are arranged and a peripheral circuit unit 2 in which peripheral circuits are arranged will be described with reference to FIGS. 6M to 6P. The manufacturing method to be described here has a different structure from the imaging device 1000 including the section structure illustrated in FIG. 2B. In the description below, manufacturing processes m to p of the imaging device 1000 will be described with reference to the cross-sectional views in a typical process order. However, description about points common to the first embodiment is appropriately omitted.

The present embodiment is different from the imaging device 1000 of the first embodiment in that a third semiconductor region 1003 is positioned in a pixel circuit unit 1.

In the present embodiment, a first semiconductor region 1001 is an area corresponding to an accumulation region 101 and a floating diffusion region 103. A second semiconductor region 1002 is an area corresponding to sources/drains 108 and 109. A third semiconductor region 1003 is an area corresponding to an impurity region 102 of a reference contact of the pixel circuit unit 1. Further, the third semiconductor region 1003 is an area corresponding to a source 104, a drain 105, a drain 106, and a source 107. The pixel circuit unit 1 includes a pixel MOS transistor having an LDD structure. Then, the third semiconductor region 1003 is an area corresponding to an N-type low-concentration impurity region 1061 and an N-type high-concentration impurity region 1062 of a source or drain of the pixel MOS transistor having an LDD structure. Further, the present embodiment includes a fourth semiconductor region 1004. The fourth semiconductor region 1004 is positioned in the peripheral circuit unit 2, and includes a semiconductor region in which an impurity region 110 of a reference element of the peripheral circuit unit 2 is provided.

A first polysilicon member includes a gate electrode 122. A second polysilicon member includes gate electrodes 128 and 129. A third polysilicon member includes gate electrodes 125, 126, and 127.

(Process m)

Figure 6M:
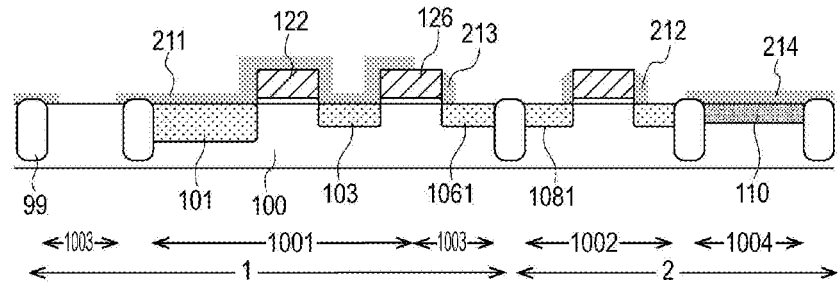
FIGS. 6M to 6P are schematic cross-sectional views illustrating a method of manufacturing the imaging device.

FIG. 6M illustrates a state that has gone through a process m of forming a first insulator member 211. The process m is a process belonging to the process c illustrated in FIG. 3C. Before the process m, a process a' of forming a polysilicon member on the semiconductor layer 100, and forming an impurity region on the semiconductor layer 100, which is similar to the process a, has been passed through. In the process a', the impurity region 110 of the resistance element is formed in the fourth semiconductor region 1004. A dosage for formation of the impurity region 110 is $5 \times 10^{12}$ to $5 \times 10^{16}$ [ions/cm$^2$], favorably $5 \times 10^{14}$ to $5 \times 10^{16}$ [ions/cm$^2$], and more the process m, a process b' of forming a first insulator film 210, which is similar to the process b, has been passed through.

In process m, some portion of the first insulator film 210 formed in the process b', the some portion being positioned on the third semiconductor region 1003, is removed. To be specific, some portion positioned on the area corresponding to the impurity region 102 of the reference contact. Further, some portion positioned on areas corresponding to the source/drain of the pixel MOS transistor is removed. Further, certain portions of the first insulator film 210, which are positioned on side surfaces of the gate electrode 126, are remained. The certain portions of the first insulator film 210, which are positioned on the side surfaces of the gate electrode 126, are side wall spacers 213 with respect to the gate electrode 126 of the pixel MOS transistor that is a polysilicon member.

In the present embodiment, then, a portion of the first insulator film 210, which is positioned on the impurity region 110, is remained in the present process m. The portion of the first insulator film 210, which is positioned on the impurity region 110, covers the impurity region 110 as an insulator member 214.

The third semiconductor region 1003 includes the drain 106 that is an impurity region of the MOS transistor having an LDD structure of the pixel circuit unit 1, and the portion of the first insulator film 210, which is positioned on the third semiconductor region 1003, covers the source/drain of the MOS transistor.

(Process n)

Figure 6N:
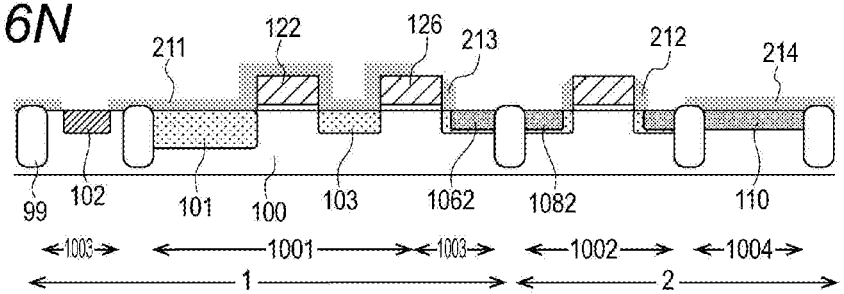

FIG. 6N illustrates a state that has gone through a process n of forming an impurity region on the semiconductor layer 100. The process n is a process similar to the process d illustrated in FIG. 3D. With the process n, the impurity region 110 of the resistance element is formed. Further, the high-concentration impurity region 1062 of the source/drain 106 of the pixel MOS transistor having an LDD structure is formed. The LDD structure is formed by introduction of an impurity with a higher dosage (second dosage) than a dosage (first dosage) at the time of forming an N-type high-concentration impurity region 1062.

Further, the high-concentration impurity region 1082 of the source/drain 108 of the peripheral NMOS transistor having an LDD structure is formed. The N-type high-concentration impurity region 1062 of the pixel MOS transistor, and an N-type high-concentration impurity region 1082 of a peripheral MOS transistor can be formed at the same time. That is, introduction of an impurity to the first semiconductor region 1001 for the impurity region 1062, and introduction of an impurity to the second semiconductor region 1002 for the impurity region 1082 can be performed in parallel. Therefore, the impurity concentration of the N-type high-concentration impurity region 1062 and the impurity concentration of the N-type high-concentration impurity region 1082 could be the same level (one is 0.5 to 2.0 times of the other).

Further, in the process n, a P-type high-concentration impurity region of a source/drain 109 of a peripheral PMOS transistor is formed. Further, in the process n, a P-type impurity region 102 of the reference contact is formed. Formation of the P-type high-concentration impurity region and formation of the P-type impurity region 102 can be performed in parallel. Therefore, the dosage in ion implantation at the time of forming the impurity region 102 and the dosage in ion implantation at the time of forming the P-type high-concentration impurity region of the source/drain 109 may be the same. As a result, the impurity concentration of the impurity region 102 and the impurity concentration of the P-type high-concentration impurity region could be the same level (one is 0.5 to 2.0 times of the other). The dosage for the formation of the impurity region 102 is $5\times10^{12}$ to $5\times10^{16}$ [ions/cm$^2$], favorably $5\times10^{14}$ to $5\times10^{16}$ [ions/cm$^2$], and more favorably $1\times10^{15}$ to $1\times10^{16}$ [ions/cm$^2$].

Following that, similarly to the process e illustrated in FIG. 4E, a second insulator film 220 is formed. The second insulator film 220 covers the insulator member 214 that is a portion of the first insulator film 210, which has been remained on the impurity region 110 of the resistance element.

(Process o)

Figure 6O:
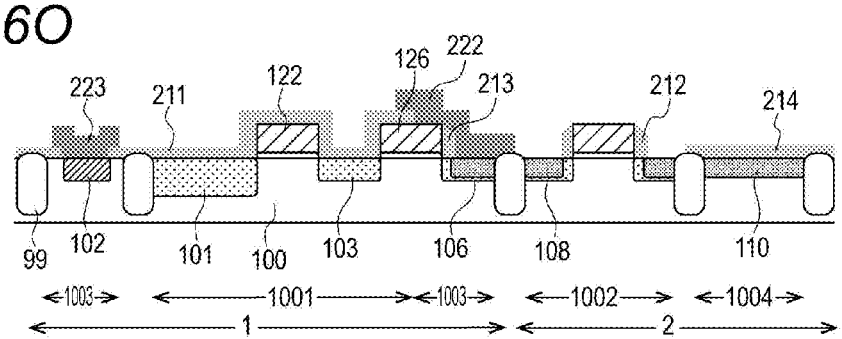

FIG. 6O illustrates a state that has gone through a process o of forming a second insulator member 221. The process o is a process similar to the process f illustrated in FIG. 4F. In the process f, a portion of the second insulator film 220, which is positioned on the first semiconductor region 1001, and a portion positioned on the second semiconductor region 1002 are removed. Further, a portion of the second insulator film 220, which is positioned on the fourth semiconductor region 1004, is removed. At this time, the portion of the second insulator film 220, which is positioned on the third semiconductor region 1003, is remained.

A portion of the second insulator film 220, which has been remained on the drain 106, covers the source/drain of the pixel MOS transistor, as an insulator member 222. The second insulator film 220 is also remained on the source 104, the drain 105, and the source 107. Further, some portion of the second insulator film 220, which has been remained on the impurity region 102, covers the impurity region 102, as an insulator member 223.

Further, a portion of the second insulator film 220, which is positioned on the first polysilicon member, and a portion of the second insulator film 220, which is positioned on the second polysilicon member, are removed. At this time, a portion of the second insulator film 220, which is positioned on the third polysilicon member, is remained. The portion of the second insulator film 220, which has been remained on the third polysilicon member, is the insulator member 222. The insulator member 222 covers the gate electrodes 126, 125, and 127. Meanwhile, the insulator member 222 does not cover the gate electrode 122.

Following that, similarly to the process g illustrated in FIG. 4G, a metal film that could react with the semiconductor region and the polysilicon member to form a metal compound layer is formed.

(Process p)

Figure 6P:
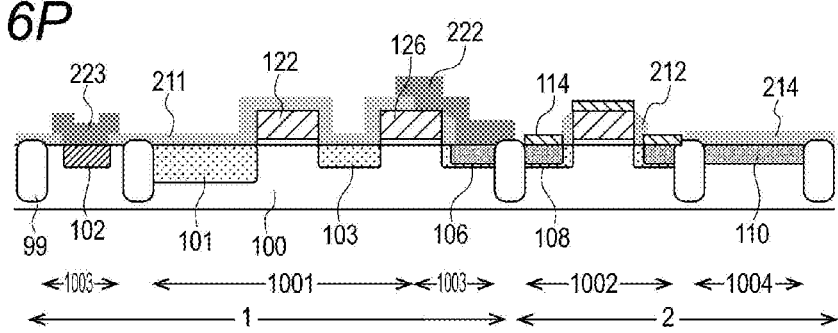

FIG. 6P illustrates a state that has gone through a process p of forming metal compound layers 131 and 132. The process p is a process similar to the process h illustrated in FIG. 4H. In the process p, a metal film and the second semiconductor region 1002 are caused to react with each other, and the metal compound layer 131 is formed. Further, a metal film and the second polysilicon member are caused to react with each other, and the metal compound layer 132 is formed.

At this time, the metal film is blocked by the first insulator member 211 and does not react with the first semiconductor region 1001 and the first polysilicon member (gate electrode 122), and a monosilicide layer is not formed. Similarly, the metal film is blocked by the insulator members 222 and 223 and does not react with the third semiconductor region 1003 and the third polysilicon members (gate electrodes 125, 126, and 127), and a monosilicide is not formed.

The impurity region 102 and the pixel MOS transistor positioned in the pixel circuit unit 1 are arranged in the vicinity of the accumulation region 101. Therefore, formation of the metal compound layer on the impurity region 102 and the source/drain of the pixel MOS transistor becomes a cause of a decrease in image quality such as a white flaw. In the present embodiment, the insulator members 222 and 223 formed from the second insulator film 220 block the reactions of the metal films, whereby favorably image quality can be obtained. Then, a portion of the second insulator film 220, which overlaps with the first insulator member 211, is removed. Accordingly, a difference of elevation between the peripheral circuit unit 2 in which both of the first insulator film 210 and the second insulator film 220 are removed, and an upper structure of the second semiconductor region 1002 can be decreased.

Following that, processes similar to the processes i to l illustrated in FIGS. 5I to 5L are performed, and the imaging device 1000 can be manufactured.

Third Embodiment

A method of manufacturing an imaging device 1000 that includes a pixel circuit unit 1 in which pixel circuits 10 are arranged and a peripheral circuit unit 2 in which peripheral circuits are arranged will be described with reference to FIGS. 7Q to 7T. The manufacturing method described here has a different structure from the imaging device 1000 having the section structure illustrated in FIG. 2B. In the description below, manufacturing processes q to t of the imaging device 1000 will be described with reference to the cross-sectional views in a typical process order.

The present embodiment is different from the imaging device 1000 of the first and second embodiments in that a polysilicon member is used as a resistance element, instead of an impurity region.

In the present embodiment, a first semiconductor region 1001 is an area corresponding to an accumulation region 101, a floating diffusion region 103, a source 104, a drain 105, a drain 106, and a source 107. A second semiconductor region 1002 is an area corresponding to sources/drains 108 and 109. A third semiconductor region 1003 is an area corresponding to an impurity region 102.

Further, a semiconductor layer 100 further includes a fifth semiconductor region 1005. A polysilicon member 120 as a resistance element is provided on a fourth semiconductor region 1004.

A first polysilicon member includes gate electrodes 122, 125, 126, and 127. A second polysilicon member includes gate electrodes 128 and 129. A third polysilicon member includes a polysilicon member 120 as a resistance element.

(Process q)

Figure 7Q:
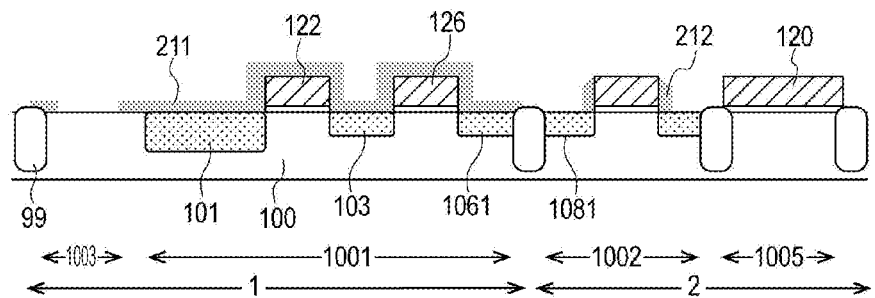
FIGS. 7Q to 7T are schematic cross-sectional views illustrating a method of manufacturing the imaging device.

FIG. 7Q illustrates a state that has gone through a process q of forming a first insulator member 211. The process q is a process similar to the process c illustrated in FIG. 3C.

Before the process m, a process a" of forming a polysilicon member on the semiconductor layer 100, and forming an impurity region on the semiconductor layer 100, which is similar to the process a, has been passed through. In the process a", a polysilicon member 120 of a resistance element is provided on the fifth semiconductor region 1005. Further, before the process m, a process b" of forming a first insulator film 210, which is similar to the process b, has been passed through. In the process b", the first insulator film 210 is formed to cover the polysilicon member 120. In the process q, a portion of the first insulator film 210, which is positioned on the polysilicon member 120, is removed.

Following that, similarly to the process e illustrated in FIG. 4E, a second insulator film 220 is formed.

(Process r)

Figure 7R:
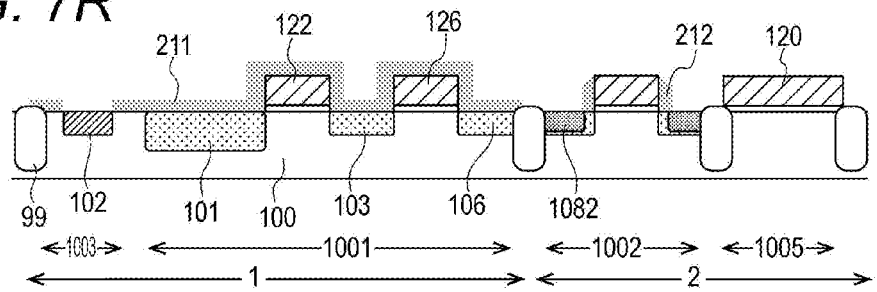

FIG. 7R illustrates a state that has gone through a process r of introducing an impurity to the third polysilicon member. The process r is a process similar to the process d illustrated in FIG. 3D. In the process r, an impurity is introduced to the polysilicon member 120. Accordingly, resistivity of the polysilicon member 120 can be caused to be a desired value. The introduction of an impurity to the polysilicon member 120 can be performed in parallel with formation of a high-concentration impurity region of the sources/drains 108 and 109 of a peripheral MOS transistor. The dosage for the formation of the high-concentration impurity region of the sources/drains 108 and 109 of the peripheral MOS transistor is sufficient to appropriately decrease the resistivity of the polysilicon member 120 as the resistance element. Further, in the process r, an impurity region 102 for a reference contact is formed. Formation of the impurity region 102 is similar to that of the second embodiment.

(Process s)

Figure 7S:
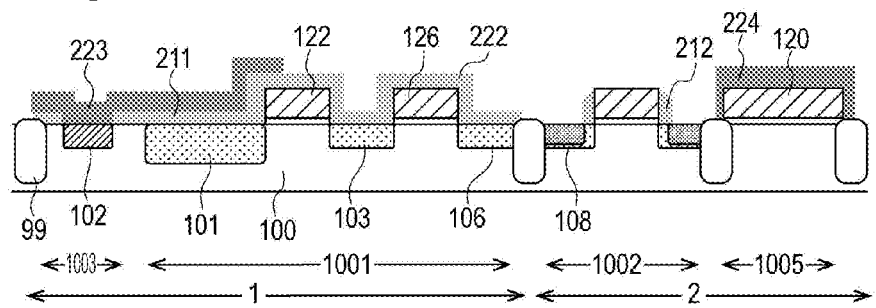

FIG. 7S illustrates a state that has gone through a process s of forming a second insulator member 221. The process s is a process similar to the process f illustrated in FIG. 4F. In the process s, portions of the second insulator film 220, which are positioned on the first semiconductor region 1001 and the first polysilicon member (gate electrodes 122, 125, 126, and 127), are removed. Further, portions of the second insulator film 220, which are positioned on the second semiconductor region 1002 and the second polysilicon member (gate electrodes 128 and 129), are removed.

At this time, a portion of the second insulator film 220, which is positioned on the third polysilicon member (polysilicon member 120), is remained. The portion of the second insulator film 220, which is positioned on the third polysilicon member (polysilicon member 120), covers side surfaces and an upper surface of the polysilicon member 120, as an insulator member 224. The portions of the second insulator film 220, which are positioned on the source 104, the drain 105, the drain 106, and the source 107, are removed, whereby a difference of elevation between the peripheral circuit unit 2 and the insulator member can be reduced.

Meanwhile, a portion of the second insulator film 220, which is positioned on the accumulation region 101, is remained. Accordingly, damage to a photoelectric conversion element 11 (accumulation region 101) at the time of etching can be decreased. Therefore, a dark current can be suppressed. Here, an example in which the accumulation region 101 and the impurity region 102 are positioned on the same active region, and an insulator member 223 that covers the impurity region 102 extends on the accumulation region 101 has been described. However, the insulator member that covers the accumulation region 101 and an insulator member that covers the impurity region 102 may be separate insulator members formed from the second insulator film 220.

(Process t)

Figure 7T:
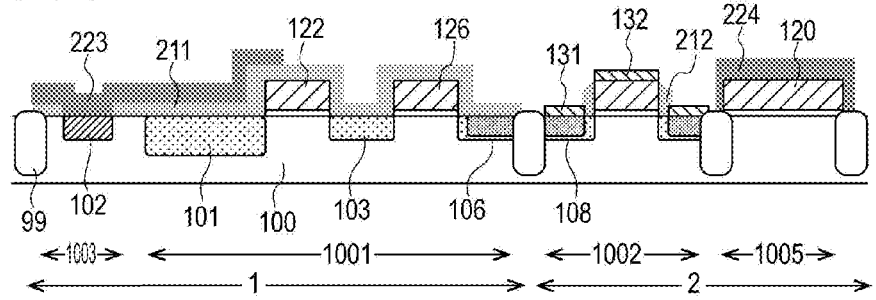

FIG. 7T illustrates a state that has gone through a process t of forming metal compound layers 131 and 132. The process t is a process similar to the process h illustrated in FIG. 4H. In the process t, the polysilicon member 120 is blocked to react with a metal film by the insulator member 224 that covers the polysilicon member 120 as a resistance element. Accordingly, reduction of resistance of the polysilicon member 120 as a resistance element can be suppressed.

In the above description, the description has been made where the signal charge is an electron. However, the signal charge may be a P type. In the imaging device, a conductivity type where the signal charge is the majority carrier can be called first conductivity type, and a conductivity type where the signal charge is the minority carrier can be called second conductivity type. For example, when the signal charge is an electron, the first conductivity type is the N type and the second conductivity type is the P type. When the signal charge is a hole, the first conductivity type is the P type and the second conductivity type is the N type.

Further, in the description above, the embodiment has been described, in which the first insulator film 210 is formed in a prior process to the second insulator film 220, and a part of the second insulator film 220 is removed from the first insulator member 211 formed from the first insulator film 210. However, the order may be reversed. That is, an embodiment in which the second insulator film 220 is formed in a prior process to the first insulator film 210, and a part of the first insulator film 210 is removed from the second insulator member 221 formed from the second insulator film 220 may be employed.

Further, the third semiconductor region 1003 from which the first insulator film is removed, and then, to which the second insulator film is remained may exist in at least one of the pixel circuit unit 1 and the peripheral circuit unit 2. The first to third embodiments can be appropriately combined. For example, regarding the configuration of the pixel circuit unit 1, the second embodiment can be employed, and regarding the configuration of the peripheral circuit unit 2, the third embodiment can be employed. Further, an embodiment in which the respective types of resistance elements described in the first to third embodiments are mixed in the peripheral circuit unit 2 can be employed.

In the above description, the embodiment in which both of the second semiconductor region 1002 and the second polysilicon member are caused to react with the metal film 130, and the metal compound layers 131 and 132 are formed has been described. However, one of the second semiconductor region 1002 and the second polysilicon member can be caused not to react with the metal film 130. For example, regarding the polysilicon member, the conductivity is higher than the single crystal silicon. Therefore, the metal compound layer may not be formed. In that case, the conductor member formed by the first insulator film 210 and the second insulator film 220 can block the silicidation of the polysilicon member. Further, a hard mask used in patterning when the polysilicon member is formed is not removed and is remained, whereby the silicide process can be performed using the hard mask as a mask.

According to the above-described embodiments, a difference of elevation of insulators between the pixel circuit unit and the peripheral circuit unit can be decreased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-251385, filed Dec. 4, 2013, which is hereby incorporated by reference herein in its entirety.

What is claimed is:

1. A method of manufacturing an imaging device including a pixel circuit unit and a peripheral circuit unit, the method comprising:
    forming a first insulator film that covers a first semiconductor region positioned in the pixel circuit unit, a second semiconductor region positioned in the peripheral circuit unit, and a third semiconductor region positioned in the peripheral circuit unit;
    removing one portion of the first insulator film, the one portion of the first insulator film being positioned on the second semiconductor region, and another portion of the first insulator film, the another portion of the first insulator film being positioned on the third semiconductor region, while remaining a first portion of the first insulator film, the first portion being positioned on the first semiconductor region;
    forming a second insulator film that covers the first semiconductor region, the second semiconductor region, and the third semiconductor region;
    removing one portion of the second insulator film, the one portion of the second insulator film being positioned on the first portion, and another portion of the second insulator film, the another portion of the second insulator film being positioned on the second semiconductor region, while remaining a second portion of the second insulator film, the second portion being positioned on the third semiconductor region;
    forming a metal film that covers the first portion, the second semiconductor region, and the second portion;
    causing the metal film and the second semiconductor region to react with each other to form a metal compound layer; and
    forming a third insulator film that covers the first portion, the metal compound layer, and the second portion, and
    forming a conductor member that penetrates the third insulator film and comes in contact with the metal compound layer.

2. The method of manufacturing an imaging device according to claim 1, wherein
    an impurity is introduced to the third semiconductor region, after the another portion of the first insulator film, is removed, and before the second insulator film is formed.

3. The method of manufacturing an imaging device according to claim 2, wherein
    an impurity is introduced to the second semiconductor region, after the one portion of the first insulator film is removed, and before the second insulator film is formed, and
    the introduction of an impurity to the second semiconductor region and the introduction of an impurity to the third semiconductor region are performed in parallel.

4. The method of manufacturing an imaging device according to claim 1, wherein
    an impurity is introduced to the first semiconductor region and the second semiconductor region with a first dosage, before the first insulator film is formed, and
    an impurity is introduced to the second semiconductor region and the third semiconductor region with a second dosage higher than the first dosage, after the one portion of the first insulator film is removed, and before the second insulator film is formed.

5. The method of manufacturing an imaging device according to claim 1, wherein a gate electrode is provided below the first insulator film and above the second semiconductor region, and
    a side wall spacer with respect to the gate electrode is formed from the first insulator film, when the one portion of the first insulator film is removed.

6. The method of manufacturing an imaging device according to claim 1, wherein the third semiconductor region includes an area in which a resistance element of the peripheral circuit unit is provided,
    an impurity region of the resistance element is formed in the area in which the resistance element is provided, after the another portion of the first insulator film, the another portion of the first insulator film being positioned on the area in which the resistance element is provided, is removed, and
    the second portion covers the impurity region of the resistance element.

7. The method of manufacturing an imaging device according to claim 1, wherein the first semiconductor region includes an impurity region of a photoelectric conversion element of the pixel circuit unit, the first portion of the first insulator film, the first portion being remained on the first semiconductor region, covers the impurity region of the photoelectric conversion element, and the one portion of the second insulator film, the one portion of the second insulator film being positioned on the impurity region of the photoelectric conversion element, is removed.

8. The method of manufacturing an imaging device according to claim 1, wherein the first semiconductor region includes a floating diffusion region of the pixel circuit unit, the first portion of the first insulator film, the first portion being remained on the first semiconductor region, covers the floating diffusion region, and the one portion of the second insulator film, the one portion of the second insulator film being positioned on the floating diffusion region, is removed, and introduction of an impurity to the first semiconductor region for formation of the floating diffusion region and introduction of an impurity to the second semiconductor region are performed in parallel, before formation of the first insulator film.

9. The method of manufacturing an imaging device according to claim 1, wherein the first semiconductor region includes an impurity region of an amplifying element of the pixel circuit unit, the first portion of the first insulator film, the first portion being remained on the first semiconductor region, covers the impurity region of the amplifying element, and the one portion of the second insulator film, the one portion of the second insulator film being positioned on the impurity region of the amplifying element, is removed.

10. The method of manufacturing an imaging device according to claim 1, wherein the pixel circuit unit includes an area corresponding to a contact for supplying a reference potential of the pixel circuit unit, and
an impurity is introduced to the area corresponding to the contact, after some portion of the first insulator film, the some portion being positioned on the area corresponding to the contact, is removed, and before the second insulator film is formed.

11. The method of manufacturing an imaging device according to claim 1, wherein the pixel circuit unit includes a MOS transistor having an LDD structure, some portion of the first insulator film, the some portion being positioned on an impurity region of the MOS transistor, is removed, and a third portion of the second insulator film, the third portion being remained on the third semiconductor region after removing the one portion of the second insulator film, covers the impurity region of the MOS transistor.

12. The method of manufacturing an imaging device according to claim 1, wherein a fourth portion of the first insulator film covers an impurity region of a resistance element of the peripheral circuit unit, and the third insulator film covers the fourth portion of the first insulator film.

13. The method of manufacturing an imaging device according to claim 1, wherein the first insulator film is formed to cover a first polysilicon member positioned on the first semiconductor region, and a second polysilicon member positioned on the second semiconductor region,
one part of the first insulator film, the one part being positioned on the second polysilicon member, is removed, while a first part of the first insulator film, the first part being positioned on the first polysilicon member, is remained,
the second insulator film is formed to cover the first part of the first insulator film, the first part being positioned on the first polysilicon member, and the second polysilicon member, and
one part of the second insulator film, the one part of the second insulator film being positioned on the first polysilicon member, and another part of the second insulator film, the another part of the second insulator film being positioned on the second polysilicon member are removed.

14. The method of manufacturing an imaging device according to claim 13, wherein the metal film covers the first part of the first insulator film and the second polysilicon member, and
the metal film and the second polysilicon member are caused to react with each other, and a silicide layer is formed on the second polysilicon member.

15. A method of manufacturing an imaging device including a pixel circuit unit and a peripheral circuit unit, the method comprising:

forming a first insulator film that covers a first semiconductor region positioned in the pixel circuit unit, a second semiconductor region positioned in the peripheral circuit unit, and a third semiconductor region positioned in at least one of the pixel circuit unit and the peripheral circuit unit;
removing one portion of the first insulator film, the one portion of the first insulator film being positioned on the second semiconductor region, and another portion of the first insulator film, the another portion of the first insulator film being positioned on the third semiconductor region, while remaining a first portion of the first insulator film, the first portion being positioned on the first semiconductor region;
forming a second insulator film that covers the first semiconductor region, the second semiconductor region, and the third semiconductor region;
removing one portion of the second insulator film, the one portion of the second insulator film being positioned on the first portion, and another portion of the second insulator film, the another portion of the second insulator film being positioned on the second semiconductor region, while remaining a second portion of the second insulator film, the second portion being positioned on the third semiconductor region;
forming a metal film that covers the first portion, the second semiconductor region, and the second portion;
causing the metal film and the second semiconductor region to react with each other to form a metal compound layer; and
forming a third insulator film that covers the first portion, the metal compound layer, and the second portion, and forming a conductor member that penetrates the third insulator film, and comes in contact with the metal compound layer,
wherein
the first semiconductor region includes a floating diffusion region of the pixel circuit unit, the first portion of the first insulator film covers the floating diffusion region, and the one portion of the second insulator film, the one portion being positioned on the floating diffusion region, is removed.

16. A method of manufacturing an imaging device including a pixel circuit unit and a peripheral circuit unit, the method comprising:
forming a first insulator film that covers a first polysilicon member positioned in the pixel circuit unit, a second polysilicon member positioned in the peripheral circuit unit, and a third polysilicon member positioned in the peripheral circuit unit;
removing one part of the first insulator film, the one part of the first insulator film being positioned on the second polysilicon member, and another part of the first insulator film, the another part of the first insulator film being positioned on the third polysilicon member, while remaining a first part of the first insulator film, the first part being positioned on the first polysilicon member;
forming a second insulator film that covers the first part of the first insulator film, the first part being positioned on the first polysilicon member, the second polysilicon member, and the third polysilicon member;
removing one portion of the second insulator film, the one portion of the second insulator film being positioned on the first polysilicon member, and another part of the second insulator film positioned on the second polysilicon member, while remaining a second part of the second insulator film, the second part being positioned on the third polysilicon member;

forming a metal film that covers the first part positioned on the first polysilicon member, and the second polysilicon member, and the second part positioned on the third polysilicon member; and causing the metal film and the second polysilicon member to react with each other.

17. The method of manufacturing an imaging device according to claim 16, wherein an impurity is introduced to the third polysilicon member, after the another part of the first insulator film, the another portion of the first insulator film being positioned on the third polysilicon member, is removed, and before the second insulator film is formed.

18. The method of manufacturing an imaging device according to claim 16, wherein a certain part of the first insulator film is remained as a side wall spacer with respect to the second polysilicon member, when the one part of the first insulator film, the one part of the first insulator film being positioned on the second polysilicon member, is removed.

19. The method of manufacturing an imaging device according to claim 1, wherein the second insulator film is formed after the first insulator film is formed, and the third insulator film is planalized before the conductor member is formed.

20. The method of manufacturing an imaging device according to claim 1, wherein the first insulator film includes at least one of a silicon nitride layer or a silicon oxynitride layer, and the second insulator film includes a silicon oxide layer.

* * * * *